United States Patent
Yun et al.

(10) Patent No.: US 10,153,171 B2
(45) Date of Patent: Dec. 11, 2018

(54) METHOD OF FORMING PATTERNS, PATTERNS FORMED ACCORDING TO THE METHOD, AND SEMICONDUCTOR DEVICE INCLUDING THE PATTERNS

(71) Applicant: SAMSUNG SDI CO., LTD., Yongin-si, Gyeonggi-do (KR)

(72) Inventors: Huichan Yun, Suwon-si (KR); TaekSoo Kwak, Suwon-si (KR); Jin-Hee Bae, Suwon-si (KR); Jinwoo Seo, Suwon-si (KR); Kunbae Noh, Suwon-si (KR); Junyoung Jang, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/704,054

(22) Filed: Sep. 14, 2017

(65) Prior Publication Data
US 2018/0204730 A1  Jul. 19, 2018

(30) Foreign Application Priority Data
Jan. 19, 2017 (KR) .................... 10-2017-0009292

(51) Int. Cl.
*H01L 21/308* (2006.01)
*H01L 21/033* (2006.01)
(Continued)

(52) U.S. Cl.
CPC ...... *H01L 21/3086* (2013.01); *H01L 21/0337* (2013.01); *H01L 21/3081* (2013.01); *H01L 21/31144* (2013.01); *H01L 21/32139* (2013.01)

(58) Field of Classification Search
CPC .......... H01L 21/3086; H01L 21/31144; H01L 21/32139; H01L 21/3081; H01L 21/0337
See application file for complete search history.

(56) References Cited

U.S. PATENT DOCUMENTS

2009/0286402 A1   11/2009  Xia et al.
2014/0273441 A1*  9/2014  Kim ...................... H01L 21/283
                                                438/666
(Continued)

FOREIGN PATENT DOCUMENTS

EP       2 396 703 B1    6/2015
JP       2008-112192 A  5/2008
(Continued)

*Primary Examiner* — Kyoung Lee
(74) *Attorney, Agent, or Firm* — Lee & Morse, P.C.

(57) ABSTRACT

A method of forming patterns, patterns formed according to the method, and a semiconductor device including the patterns, the method including forming an etching subject layer on a substrate, forming a first layer on the etching subject layer such that the first layer has a projecting pattern, forming a second layer such that the second layer completely covers the projecting pattern of the first layer, partially removing the second layer such that a top of the projecting pattern is exposed and a patterned second layer remains at a side of the projecting pattern, removing the first layer such that a top of the etching subject layer is exposed, and etching the etching subject layer using the patterned second layer as an etching mask, wherein one of the first layer and the second layer is a carbon-containing layer and the other is a silicon-containing layer, and the silicon-containing layer is formed by coating a silicon-containing composition and heat-treating the same.

11 Claims, 7 Drawing Sheets

(51) Int. Cl.
*H01L 21/3213* (2006.01)
*H01L 21/311* (2006.01)

(56) References Cited

U.S. PATENT DOCUMENTS

2015/0200110 A1* 7/2015 Li ..................... H01L 21/31144
                                                            438/696
2015/0325441 A1* 11/2015 Tai ..................... H01L 21/0206
                                                            438/694

FOREIGN PATENT DOCUMENTS

| JP | 2008-227465 A | 9/2008 |
| JP | 2011-238795 A | 11/2011 |
| JP | 4982457 B2 | 7/2012 |
| JP | 5058733 B2 | 10/2012 |
| JP | 5661562 B2 | 1/2015 |
| KR | 10-2010-0110366 A | 10/2010 |

* cited by examiner

METHOD OF FORMING PATTERNS, PATTERNS FORMED ACCORDING TO THE METHOD, AND SEMICONDUCTOR DEVICE INCLUDING THE PATTERNS

CROSS-REFERENCE TO RELATED APPLICATION

Korean Patent Application No. 10-2017-0009292, filed on Jan. 19, 2017, in the Korean Intellectual Property Office, and entitled: "Method of Forming Patterns, and Semiconductor," is incorporated by reference herein in its entirety.

BACKGROUND

1. Field

This disclosure relates to a method of forming patterns, patterns formed according to the method, and a semiconductor device including the patterns.

2. Description of the Related Art

The semiconductor industry has developed an ultra-fine technique having a pattern of several to several tens nanometer size. Such an ultrafine technique uses effective lithographic techniques.

SUMMARY

Embodiments are directed to a method of forming patterns, patterns formed according to the method, and a semiconductor device including the patterns.

The embodiments may be realized by providing a method of forming patterns, the method including forming an etching subject layer on a substrate, forming a first layer on the etching subject layer such that the first layer has a projecting pattern, forming a second layer such that the second layer completely covers the projecting pattern of the first layer, partially removing the second layer such that a top of the projecting pattern is exposed and a patterned second layer remains at a side of the projecting pattern, removing the first layer such that a top of the etching subject layer is exposed, and etching the etching subject layer using the patterned second layer as an etching mask, wherein one of the first layer and the second layer is a carbon-containing layer and the other is a silicon-containing layer, and the silicon-containing layer is formed by coating a silicon-containing composition and heat-treating the same.

The first layer may be the carbon-containing layer, and the method may further include applying energy on a surface of the first layer after forming the first layer and prior to forming the second layer.

Coating the silicon-containing composition may include performing spin-on coating, screen printing, slit coating, or spray coating.

The method may further include rinsing the second layer with a rinse solution after forming the second layer and prior to partially removing the second layer.

Rinsing the second layer with the rinse solution may include curing a part of the second layer that has a projecting pattern and has a predetermined thickness on the first layer.

In the applying of energy on the surface of the first layer, the energy may be heat, ultraviolet (UV) light, a microwave, a sound wave, an ultrasonic wave, or a combination thereof.

The carbon-containing layer may be formed by coating or depositing an organic material including amorphous carbon, spin-on carbon, or a combination thereof.

The silicon-containing layer may include SiCN, SiOC, SiON, SiOCN, SiC, SiN, or a combination thereof.

The method may further include forming an intermediate layer after forming the etching subject layer and prior to forming the first layer.

The method may further include removing the patterned second layer after etching the etching subject layer.

The embodiments may be realized by providing a fine pattern layer formed by the method according to an embodiment.

The embodiments may be realized by providing a semiconductor device including the fine pattern layer according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
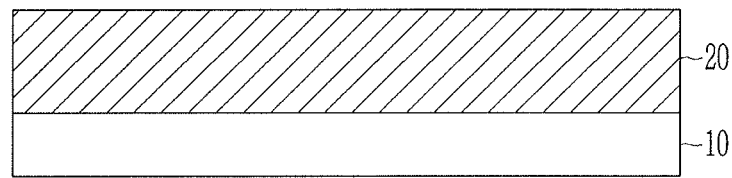
FIGS. 1 to 7 illustrate cross-sectional views of stages in a method of forming patterns according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, any singular form includes a plural form unless there is no particularly mention. As used herein, the terms "include," "including," "comprise," and/or "comprising" refer to presence of said feature, integer, step, operation, constituent element, and/or component but does not exclude addition of more than one other features, integers, steps, operations, constituent elements, components, and/or a combination thereof.

As used herein, when a definition is not otherwise provided, the term 'substituted' may refer to replacement of a hydrogen atom of a compound by a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof.

As used herein, when a definition is not otherwise provided, the term 'hetero' refers to one including 1 to 3 heteroatoms selected from N, O, S, and P.

Hereinafter, a method of manufacturing a layer structure according to one embodiment is described referring to FIGS. 1 to 7.

FIGS. 1 to 7 illustrate cross-sectional views explaining a method of forming patterns according to embodiments.

A method of forming patterns according to an embodiment may include, e.g., forming an etching subject layer on a substrate, forming a first layer having a projecting pattern or convex pattern on the etching subject layer, forming a second layer completely covering the projecting pattern of the first layer, partially removing the second layer so as to expose a top of the projecting pattern while leaving the second layer disposed at a side of the projecting pattern, removing the first layer so as to expose a top of the etching subject layer, and etching the etching subject layer using the second layer disposed at the side of a convex part of the removed first layer as an etching mask.

In an implementation, one of the first layer and second layer may be or may include a carbon-containing layer and the other of the first layer and second layer may be or may include a silicon-containing layer. In an implementation, the silicon-containing layer may be formed by coating a silicon-containing composition and heat-treating the same. In an implementation, when the first layer is the carbon-containing layer, the method may further include applying energy on a surface of the first layer between forming of the first layer and forming of the second layer. In an implementation, the carbon-containing layer may be essentially or substantially free of silicon (e.g., may not include added silicon).

Referring to FIG. 1, the etching subject layer 20 may be formed on the substrate 10.

The substrate 10 may be, e.g., a silicon wafer, a glass substrate, or a polymer substrate. In an implementation, the substrate may have a laminate form of, e.g., a silicon oxide, a silicon nitride, TiSi, silicide, polysilicon tungsten, copper, aluminum, TiN, TaN, or a combination thereof on a glass substrate or a polymer substrate.

The etching subject layer 20 may be a material to be finally patterned, e.g., a metal layer such as an aluminum layer and a copper layer, a semiconductor layer such as a silicon layer, or an insulation layer such as a silicon oxide layer and a silicon nitride layer. The etching subject layer may be formed through a method such as a chemical vapor deposition (CVD) process.

Figure 2:
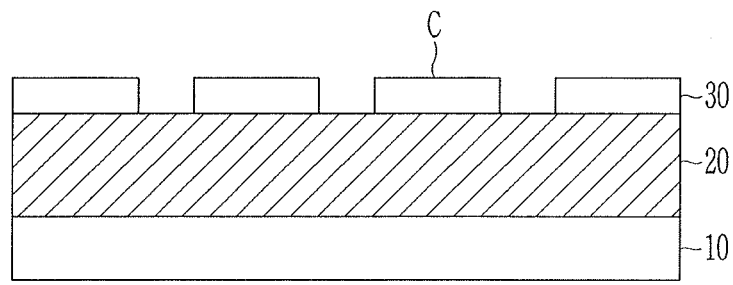
Figure 3:
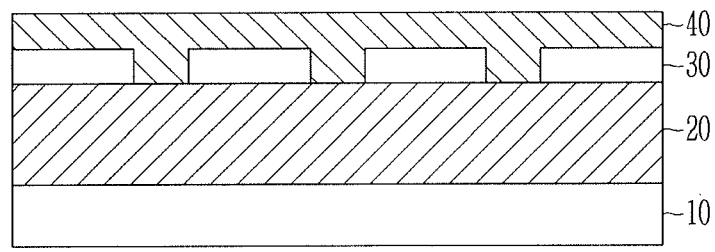

Referring to FIGS. 2 and 3, the first layer 30 having a projecting pattern (C) may be formed on the etching subject layer 20, and the second layer 40 may completely cover the projecting pattern (C) of the first layer 30.

In an implementation, the first layer 30 may be the carbon-containing layer and the second layer 40 may be the silicon-containing layer. In an implementation, the first layer 30 may be the silicon-containing layer and the second layer 40 may be the carbon-containing layer.

For example, a case in which the first layer 30 is the carbon-containing layer and the second layer 40 is the silicon-containing layer is described.

The first layer 30 (e.g., the carbon-containing layer) may be, e.g., formed by coating or depositing an organic material. In an implementation, the first layer 30 (e.g., the carbon-containing layer) may be formed by, e.g., depositing amorphous carbon on the etching subject layer 20 or coating and curing a predetermined organic material on the etching subject layer 20.

The organic material may include, e.g., an organic compound including spin-on carbon. In an implementation, the organic compound may include, e.g., a substituted or unsubstituted aromatic ring group, a substituted or unsubstituted aliphatic cyclic group, a substituted or unsubstituted hetero aromatic ring group, or a substituted or unsubstituted hetero aliphatic cyclic group in its structure.

The projecting pattern (C) of the first layer 30 may be, e.g., formed by using ArF or KrF as an exposure light source. In an implementation, the projecting pattern (C) of the first layer 30 may have a thickness ranging from several nanometers to thousands of nanometer, e.g., about 5 nanometers to about 5,000 nanometers, and two neighboring projecting patterns (C) may, e.g., be spaced apart by a distance of several nanometers to tens of micrometers.

When the first layer 30 having the projecting pattern (C) is completely formed on the etching subject layer 20, energy may be subsequently applied on the surface of the first layer 30. In an implementation, the energy may include, e.g., heat, ultraviolet (UV) light, a microwave, a sound wave, an ultrasonic wave, or a combination thereof. In an implementation, the ultraviolet (UV) light may be irradiated on the surface of the first layer 30 for about 1 minute to about 20 minutes.

Then, the second layer 40 may be formed on the surface-treated carbon-containing layer 30. In an implementation, the first layer 30 may be the carbon-containing layer and the second layer 40 may be the silicon-containing layer. The second layer 40 may be formed by coating a silicon-containing composition on the first layer 30 so that the projecting pattern (C) is completely covered. The coating may be performed by or include, e.g., a spin-on coating, screen printing, slit coating, or spray coating method. Subsequently, the composition may be cured through a heat treatment. The heat treatment may be performed, e.g., at about 100° C. to 500° C. for about 10 seconds to 1 hour. In an implementation, the heat treatment may be performed at greater than or equal to about 150° C. under an inert gas atmosphere.

The silicon-containing composition may include a silicon-containing polymer and a solvent. In an implementation, the silicon-containing polymer may include, e.g., a moiety represented by Chemical Formula 1.

[Chemical Formula 1]

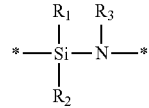

In Chemical Formula 1 $R_1$ to $R_3$ may each independently be or include, e.g., hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and the "*" is a linking point.

The silicon-containing polymer may be prepared by various methods and may be for example prepared by reacting halosilane and ammonia.

In an implementation, the silicon-containing polymer may further include a moiety represented by Chemical Formula 2 in addition to the moiety represented by Chemical Formula 1.

[Chemical Formula 2]

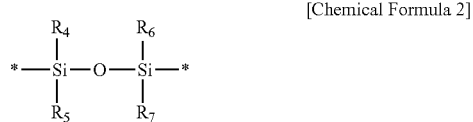

$R_4$ to $R_7$ of Chemical Formula 2 may each independently be or include, e.g., hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and the "*" is a linking point.

The second layer 40 formed by these processes may include, e.g., SiCN, SiOC, SiON, SiOCN, SiC, SiN, or a combination thereof.

In an implementation, the solvent of the silicon-containing composition may include, e.g., benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, or a combination thereof.

In an implementation, an intermediate layer, e.g., an anti-reflection layer, may be further formed between forming the etching subject layer and the first layer.

In an implementation, the method of forming patterns may include respectively disposing the carbon-containing first layer 30 and the silicon-containing second layer 40 on the etching subject layer 20 and then, using the two layers as an etching mask. In an implementation, the silicon-containing layer 40 may be particularly formed by coating and heat-treating a composition. Accordingly, the method may help simplify a manufacturing process and thus help improve a yield as well as efficiently control a pattern size and thus realize a fine pattern.

Figure 4:
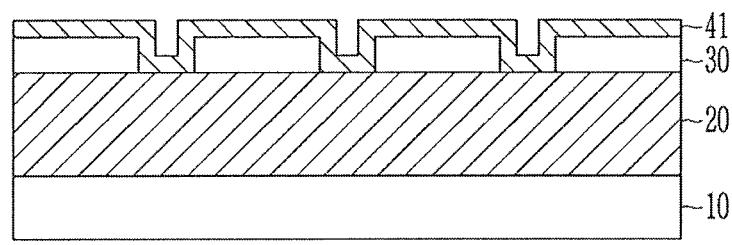
Figure 5:
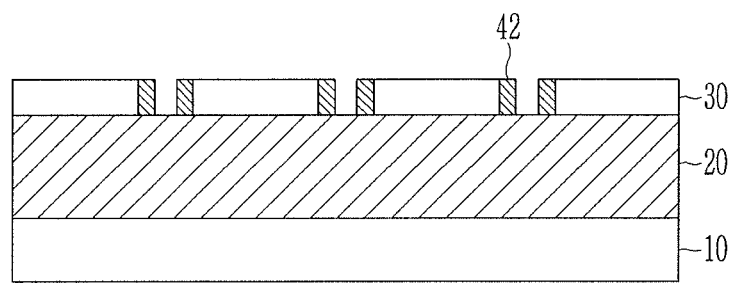

Referring to FIGS. 4 and 5, the second layer 40 may be partially removed.

First, referring to FIG. 4, the second layer is rinsed by using a rinse solution after the heat treatment. The rinse solution may remove an uncured part of the second layer 40 and may leave a cured second layer 41. Accordingly, a profile of the cured second layer 41 may be more precisely controlled and resultantly lead to realizing a fine pattern.

The rinse solution may be a suitable solution for rinsing a silica layer.

After being treated with the rinse solution, the cured second layer 41 may have a projecting pattern like the first layer 30 and a predetermined thickness on the first layer 30. The cured second layer 41 may be formed or may be present (e.g., at the bottom) between two neighboring projecting patterns of the first layer 30, at the side of the projecting pattern, and on top thereof (e.g., a side facing away from the substrate 10).

Referring to FIG. 5, the second layer on the top of the projecting pattern may be removed to expose the top of the projecting pattern with a patterned second layer 42 remaining at sides of the projecting pattern. Herein, a space between two neighboring patterned second layers 42 is a size (width) of a finally-realized fine pattern.

Figure 6:
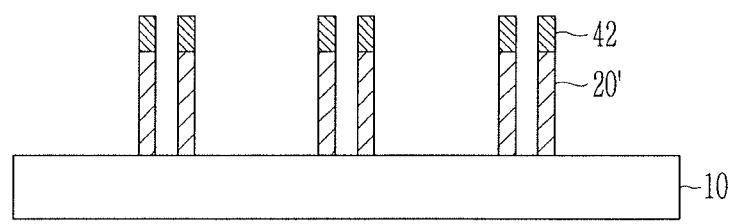

Referring to FIGS. 5 and 6, the first layer may be removed to expose the top of the etching subject layer 20, and subsequently, the etching subject layer 20 may be etched by using the patterned second layer 42 (which had been at the side of the removed convex part of the first layer) as an etching mask.

Figure 7:
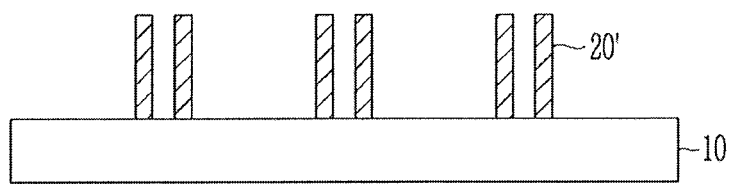

Subsequently, referring to FIGS. 6 and 7, the patterned second layer 42 remaining after etching the etching subject layer 20 may be removed to finally obtain a pattern 20'.

The method of forming patterns according to an embodiment may be to form a fine pattern by forming a carbon-containing layer as the first layer 30, a silicon-containing layer as the second layer 40 thereon, and using these two layers as an etching mask. In an implementation, a method of forming patterns may be to form a silicon-containing layer as the first layer 30, a carbon-containing layer as a second layer 40 thereon and then, using these two layers as an etching mask to realize a fine pattern.

Another embodiment may provide a fine pattern layer formed according to the aforementioned method and a semiconductor device including the fine pattern layer.

The following examples illustrate embodiments of the present disclosure in more detail. However, these examples are exemplary, and the present disclosure is not limited thereto.

Pattern Forming Process

Example 1

A line & space pattern wafer formed of spin-on carbon material (CITS-9017, Samsung SDI Co.) and a having a line width of 180 nm and a line depth of 100 nm were irradiated by UV light for 10 minutes. Subsequently, a polysilazane solution (CISD-15001, Samsung SDI Co.) was spin-coated and baked at 90° C. for 60 seconds. The coated wafer was rinsed by using m-xylene. The line & space pattern of the wafer was examined by using SEM (Hitachi SU-8230) to find out a 20 nm-thick polysilazane layer formed on an interior wall of the space.

Example 2

A line & space pattern wafer formed of a spin on glass material (CISD-15001, Samsung SDI Co.) and having a line width of 180 nm and a line depth of 100 nm. Then, a spin-on carbon material (SSCR-9219, Samsung SDI Co.) was spin-coated on the pattern wafer and baked at 1,450° C. for 90 seconds. The coated wafer was rinsed by using PGMEA (propylene glycol methyl ether acetate). When the line & space pattern of the wafer was examined by using SEM (Hitachi SU-8230), a 20 nm-thick carbon layer was formed on an interior wall of the space.

By way of summation and review, some lithographic techniques include providing a material layer on a semiconductor substrate; coating a photoresist layer thereon; exposing and developing the same to provide a photoresist pattern; and etching a subject layer using the photoresist pattern as a mask.

According to small-sizing the pattern to be formed, it could be difficult to provide a fine pattern having an excellent profile by only above-mentioned lithographic technique.

Accordingly, a silica layer may be patterned and a pattern may be transferred using the patterned silica layer as a spacer.

When the silica layer is deposited, it could be difficult to obtain a controlled fine pattern and a manufacture cost could be increased.

The embodiments may provide a method of forming a pattern including forming a carbon-containing layer and a silicon-containing layer and then, using these two layers for patterning, wherein the method forms the silicon-containing layer by coating and curing a silicon-containing composition and thus may realize a fine pattern and simultaneously, increase a yield.

Accordingly, a pattern-forming method of realizing a fine pattern as well as simplifying a manufacturing process may be provided.

| <Description of Symbols> | |
|---|---|
| 10: substrate | 20: etching subject layer |
| 30: first layer | 40: second layer |
| 41: cured second layer | 42: patterned second layer |
| 40': pattern | |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming patterns, the method comprising:
forming an etching subject layer on a substrate,
forming a first layer on the etching subject layer such that the first layer has a projecting pattern,
forming a second layer such that the second layer completely covers the projecting pattern of the first layer,
rinsing the second layer with a rinse solution after forming the second layer,
partially removing the second layer after rinsing the second layer such that a top of the projecting pattern is exposed and a patterned second layer remains at a side of the projecting pattern,
removing the first layer such that a top of the etching subject layer is exposed, and
etching the etching subject layer using the patterned second layer as an etching mask,
wherein:
one of the first layer and the second layer is a carbon-containing layer and the other is a silicon-containing layer, and
the silicon-containing layer is formed by coating a silicon-containing composition and heat-treating the same.

2. The method as claimed in claim 1, wherein:
the first layer is the carbon-containing layer, and
the method further includes applying energy on a surface of the first layer after forming the first layer and prior to forming the second layer.

3. The method as claimed in claim 1, wherein coating the silicon-containing composition includes performing spin-on coating, screen printing, slit coating, or spray coating.

4. The method as claimed in claim 1, wherein rinsing the second layer with the rinse solution includes curing a part of the second layer that has a projecting pattern and has a predetermined thickness on the first layer.

5. The method as claimed in claim 2, wherein in the applying of energy on the surface of the first layer, the energy is heat, ultraviolet (UV) light, a microwave, a sound wave, an ultrasonic wave, or a combination thereof.

6. The method as claimed in claim 1, wherein the carbon-containing layer is formed by coating or depositing an organic material including amorphous carbon, spin-on carbon, or a combination thereof.

7. The method as claimed in claim 1, wherein the silicon-containing layer includes SiCN, SiOC, SiON, SiOCN, SiC, SiN, or a combination thereof.

8. The method as claimed in claim 1, further comprising forming an intermediate layer after forming the etching subject layer and prior to forming the first layer.

9. The method as claimed in claim 1, further comprising removing the patterned second layer after etching the etching subject layer.

10. A fine pattern layer formed by the method as claimed in claim 1.

11. A semiconductor device including the fine pattern layer as claimed in claim 10.

* * * * *